US012778292B2

(12) United States Patent
Yao et al.

(10) Patent No.: US 12,778,292 B2
(45) Date of Patent: Nov. 3, 2026

(54) THREE-SECTION SLIDE RAIL DEVICE

(71) Applicant: FOSITEK CORPORATION, New Taipei City (TW)

(72) Inventors: Hsu-Hong Yao, New Taipei City (TW); Mo-Yu Zhang, New Taipei City (TW); Hsuan-Po Huang, New Taipei City (TW)

(73) Assignee: FOSITEK CORPORATION, New Taipei City (TW)

( * ) Notice: Subject to any disclaimer, the term of this patent is extended or adjusted under 35 U.S.C. 154(b) by 44 days.

(21) Appl. No.: 18/672,973

(22) Filed: May 23, 2024

(65) Prior Publication Data

US 2025/0301594 A1 Sep. 25, 2025

(30) Foreign Application Priority Data

Mar. 20, 2024 (TW) ................................ 113110275

(51) Int. Cl.
*A47B 88/49* (2017.01)
*A47B 88/443* (2017.01)
(Continued)

(52) U.S. Cl.
CPC ............ *A47B 88/49* (2017.01); *A47B 88/473* (2017.01); *A47B 88/57* (2017.01); *H05K 7/1489* (2013.01);
(Continued)

(58) Field of Classification Search
CPC ..... A47B 88/427; A47B 88/49; A47B 88/493; A47B 88/57; A47B 88/473; A47B 88/443;
(Continued)

(56) References Cited

U.S. PATENT DOCUMENTS

| | | | | |
|---|---|---|---|---|
| 9,681,749 | B2 * | 6/2017 | Chen ..................... | H05K 7/1489 |
| 10,631,639 | B2 * | 4/2020 | Chen ..................... | H05K 7/1489 |

(Continued)

FOREIGN PATENT DOCUMENTS

| | | | |
|---|---|---|---|
| CN | 107592771 | A * | 1/2018 |
| CN | 107592771 | B | 5/2023 |

OTHER PUBLICATIONS

Search Report appended to an Office Action, which was issued to Taiwanese counterpart application No. 113110275 by the TIPO on Apr. 30, 2025, with an English translation thereof.

*Primary Examiner* — Kimberley S Wright
(74) *Attorney, Agent, or Firm* — BURRIS LAW, PLLC

(57) ABSTRACT

A three-section slide rail device includes an outer section, a middle section and an inner section. The outer section includes an outer rail having an extension block formed on a sliding surface. The middle section includes an anti-retraction locking member pivotably connected with a middle rail. The inner section includes an inner rail having an abutment plate formed on an inner surface. The abutment plate abuts against and urges upwardly the anti-retraction locking member to keep the anti-retraction locking member. When the inner section is moved relative to the middle section to disengage the abutment plate from the anti-retraction locking member, the anti-retraction locking member is permitted to turn downwardly to allow the middle section to move to a short extended state, where the anti-retraction locking member abuts against the extension block to prevent a further extending movement of the middle section.

5 Claims, 23 Drawing Sheets

(51) Int. Cl.

| | |
|---|---|
| ***A47B 88/473*** | (2017.01) |
| ***A47B 88/57*** | (2017.01) |
| ***H05K 7/14*** | (2006.01) |
| *A47B 88/423* | (2017.01) |
| *A47B 88/427* | (2017.01) |
| *A47B 88/493* | (2017.01) |

(52) U.S. Cl.
CPC ..... *A47B 88/423* (2017.01); *A47B 2088/4235* (2017.01); *A47B 88/427* (2017.01); *A47B 88/493* (2017.01); *A47B 2210/0016* (2013.01); *A47B 2210/0018* (2013.01); *A47B 2210/007* (2013.01); *A47B 2210/0081* (2013.01)

(58) Field of Classification Search
CPC ...... A47B 2210/007; A47B 2210/0016; A47B 2210/0018; A47B 2210/0081; A47B 2088/4235; H05K 7/1489
See application file for complete search history.

(56) References Cited

U.S. PATENT DOCUMENTS

| | | | | |
|---|---|---|---|---|
| 11,134,776 | B2 * | 10/2021 | Chen | A47B 88/497 |
| 12,127,671 | B2 * | 10/2024 | Chen | A47B 88/45 |
| 2016/0296017 | A1 * | 10/2016 | Chen | H05K 7/183 |
| 2019/0082836 | A1 * | 3/2019 | Chen | A47B 88/49 |
| 2021/0145173 | A1 * | 5/2021 | Chen | A47B 88/443 |
| 2022/0192376 | A1 * | 6/2022 | Chen | A47B 88/57 |
| 2022/0240673 | A1 * | 8/2022 | Chen | A47B 88/49 |
| 2024/0324768 | A1 * | 10/2024 | Yao | F16C 29/02 |
| 2024/0324770 | A1 * | 10/2024 | Yao | A47B 88/493 |

* cited by examiner

THREE-SECTION SLIDE RAIL DEVICE

CROSS-REFERENCE TO RELATED APPLICATION

This application claims priority to Taiwanese Patent Application No. 113110275, filed on Mar. 20, 2024, and incorporated by reference herein in its entirety.

FIELD

The disclosure relates to a slide rail device, and more particularly to a three-section slide rail device extendable in a short extended state.

BACKGROUND

A conventional three-section slide rail device is adapted for mounting a server case thereon, and includes an outer rail, a middle rail and an inner rail. Retaining mechanisms are disposed between the outer rail and the middle rail, and between the middle rail and the inner rail to prevent undesired removal from each other. The server case is required to be pulled out from the slide rail device for performing a maintenance task, which results in an operator having limited space to perform maintenance during the maintenance task. When the slide rail device is extended to the longest state and supports the bulky server case thereon to be operated by the operator, the risk of damage to the slide rail device and the operator is relatively high.

SUMMARY

Therefore, an object of the disclosure is to provide a three-section slide rail device that can alleviate at least one of the drawbacks of the prior art.

According to the disclosure, the three-section slide rail device includes an outer section, a middle section and an inner section. The outer section includes an outer rail. The outer rail has a sliding surface and an extension block formed on the sliding surface. The middle section includes a middle rail which is disposed on and slidable along the outer rail to shift the three-section slide rail device from a retracted state to a first extended state, and an anti-retraction locking member which is pivotably connected with the middle rail adjacent to a proximal end of the middle rail. The inner section includes an inner rail which is disposed on and slidable along the middle rail to shift the three-section slide rail device from the first extended state to a second extended state. The inner rail has an inner surface which faces the middle rail, and an abutment plate which is formed on the inner surface adjacent to a proximal end of the inner rail. The abutment plate abuts against and urges upwardly the anti-retraction locking member to keep the anti-retraction locking member in the retracted state. When the inner section is moved relative to the middle section to disengage the abutment plate from the anti-retraction locking member, the anti-retraction locking member is permitted to turn downwardly so as to allow the middle section to move relative to the outer section to a short extended state, where the anti-retraction locking member abuts against the extension block to prevent a further extending movement of the middle section relative to the outer section.

With the anti-retraction locking member abutting against the extension block, the middle section is moved relative to the outer section and positioned in the short extended state to prevent further extension of the middle section relative to the outer section. Since the extension length of the middle section from the outer section is shortened, an operating space can be provided to facilitate conducting of maintenance, and the torque applied to the three-section slide rail device by the server case is also reduced to prevent the inner section and the server case from slipping and falling over from the middle section and damaging the operator and the server case.

BRIEF DESCRIPTION OF THE DRAWINGS

Other features and advantages of the disclosure will become apparent in the following detailed description of the embodiment with reference to the accompanying drawings. It is noted that various features may not be drawn to scale.

DETAILED DESCRIPTION

Figure 1:
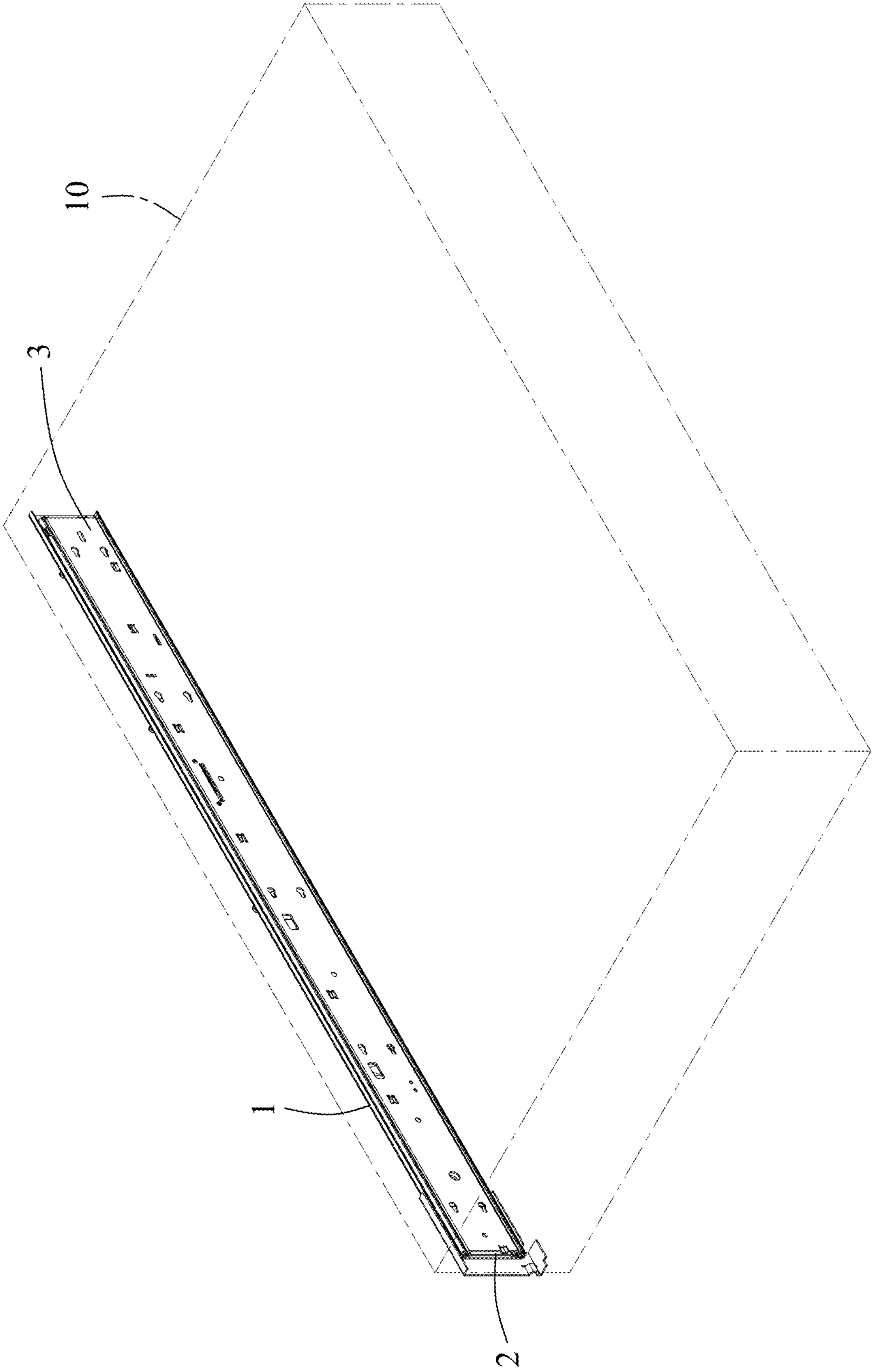
FIG. 1 is a perspective view illustrating an embodiment of a three-section slide rail device according to the disclosure.

It should be noted herein that for clarity of description, spatially relative terms such as "top," "bottom," "upper," "lower," "on," "above," "over," "downwardly," "upwardly" and the like may be used throughout the disclosure while making reference to the features as illustrated in the drawings. The features may be oriented differently (e.g., rotated 90 degrees or at other orientations) and the spatially relative terms used herein may be interpreted accordingly.

Figure 2:
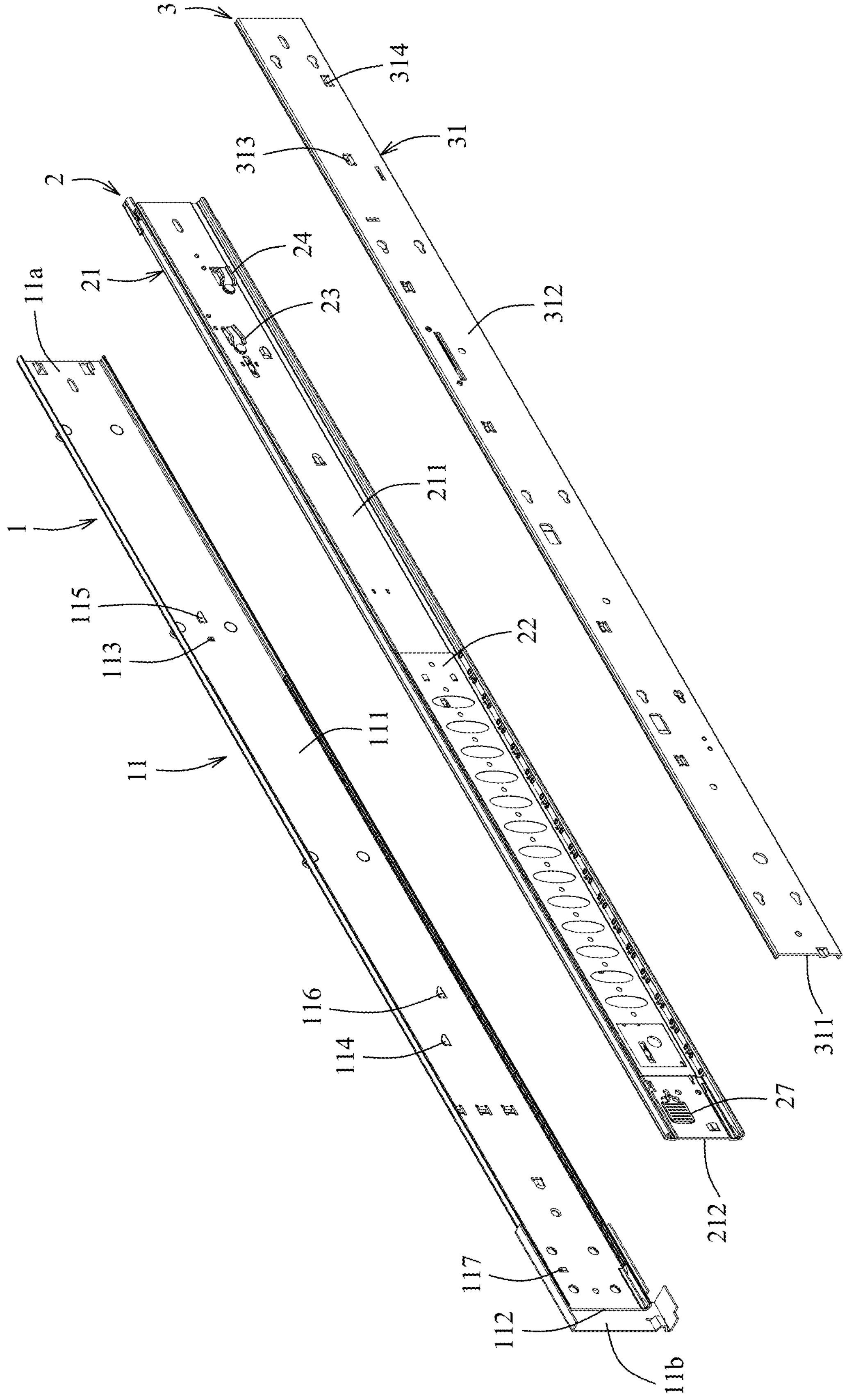
FIG. 2 is an exploded perspective view of the embodiment.

Referring to FIGS. 1 and 2, an embodiment of a three-section slide rail device according to the disclosure is adapted to be mounted on a server rack (not shown) for supporting a server case 10. Specifically, the server rack is provided with two slide rail devices at two lateral sides of the server case 10 (only one is shown in FIG. 1) for connecting and supporting the server case 10. Each three-section slide rail device includes an outer section 1, a middle section 2 slidably disposed on the outer section 1, and an inner section 3 slidably disposed on the middle section 2. The outer section 1 is securely mounted on the serve rack. The inner section 3 is connected with a lateral side of the server case 10.

Figure 3:
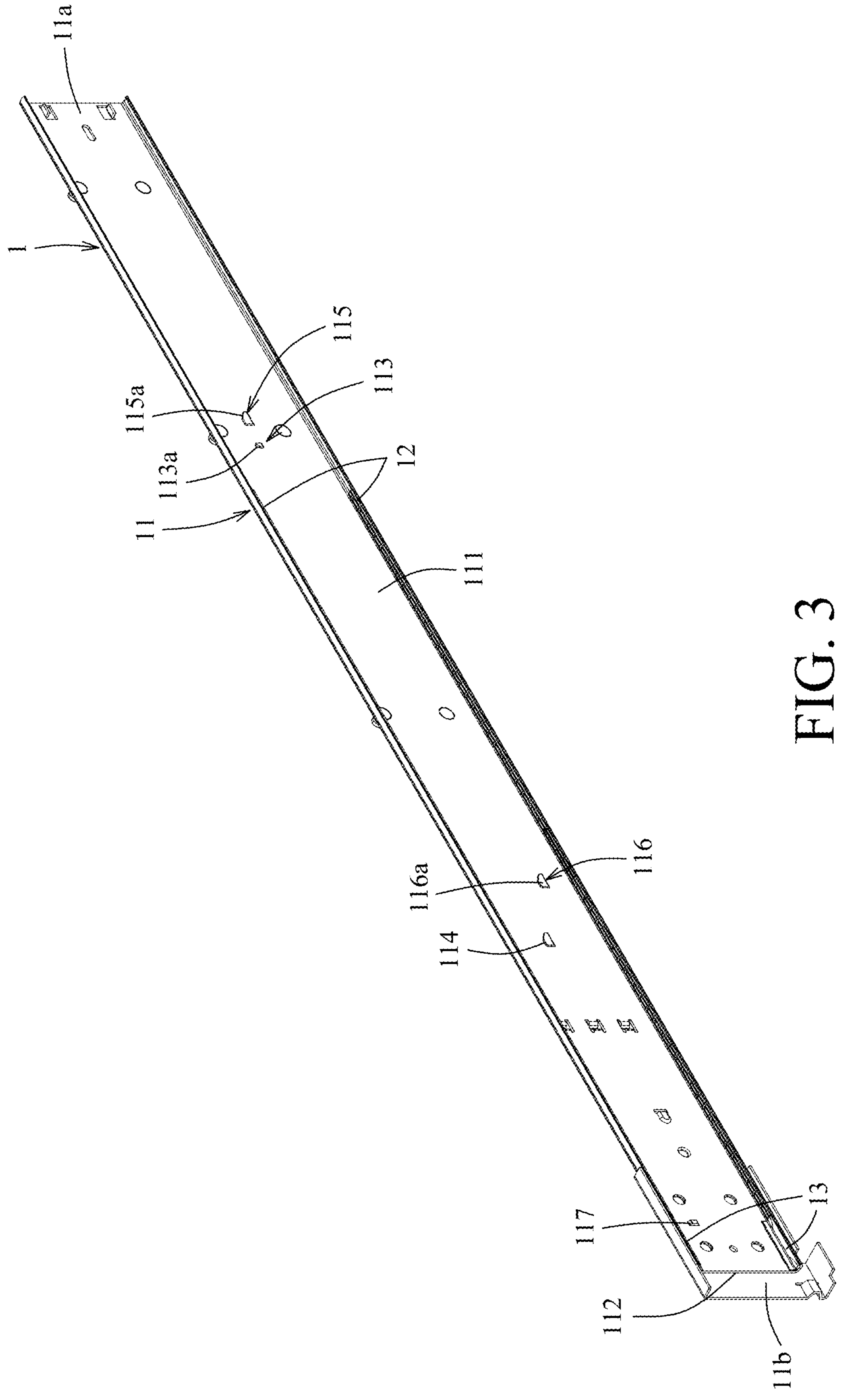
FIG. 3 is a perspective view of an outer section of the embodiment.
Figure 4:
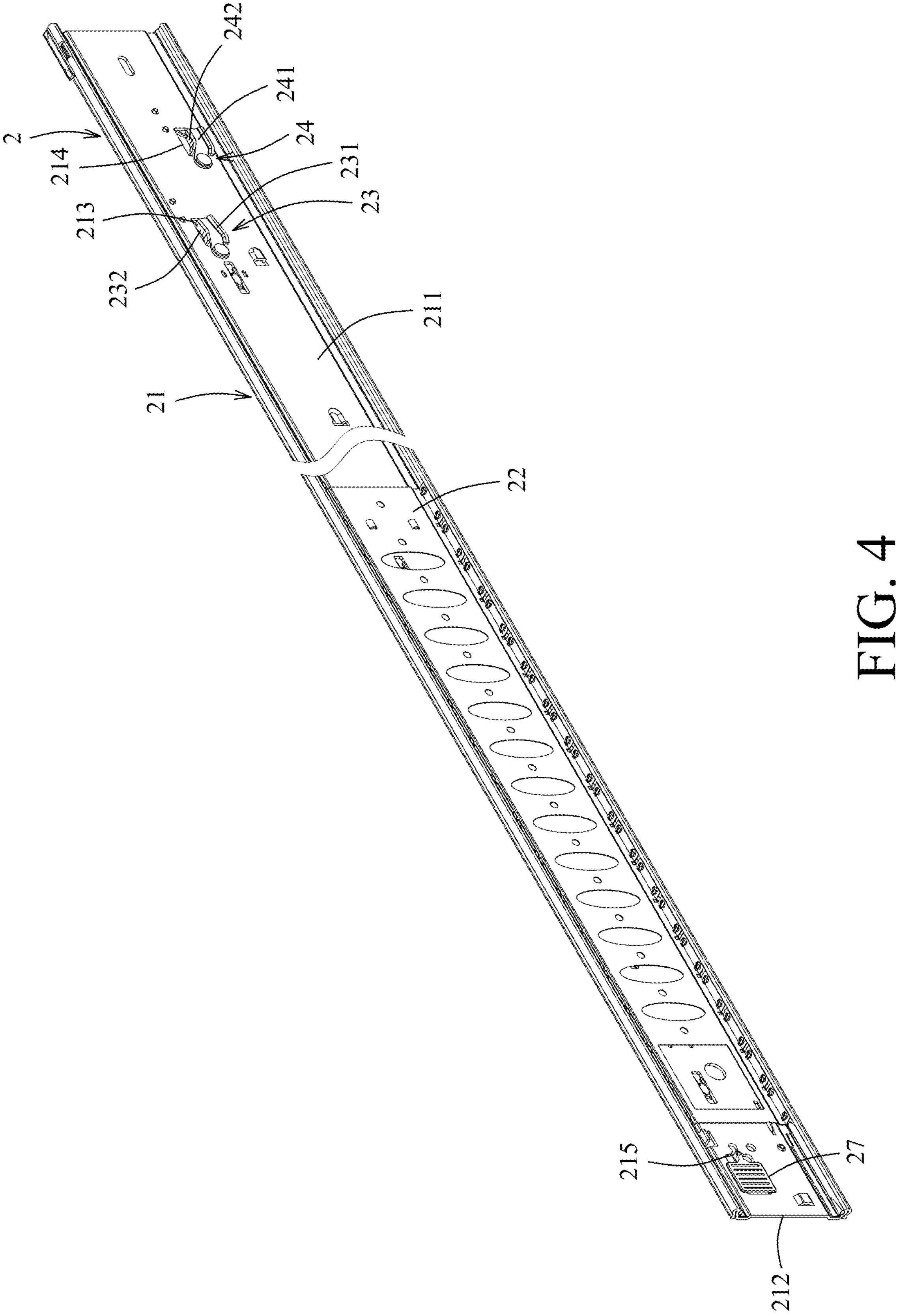
FIG. 4 is a fragmentary perspective view of a middle section of the embodiment.
Figure 5:
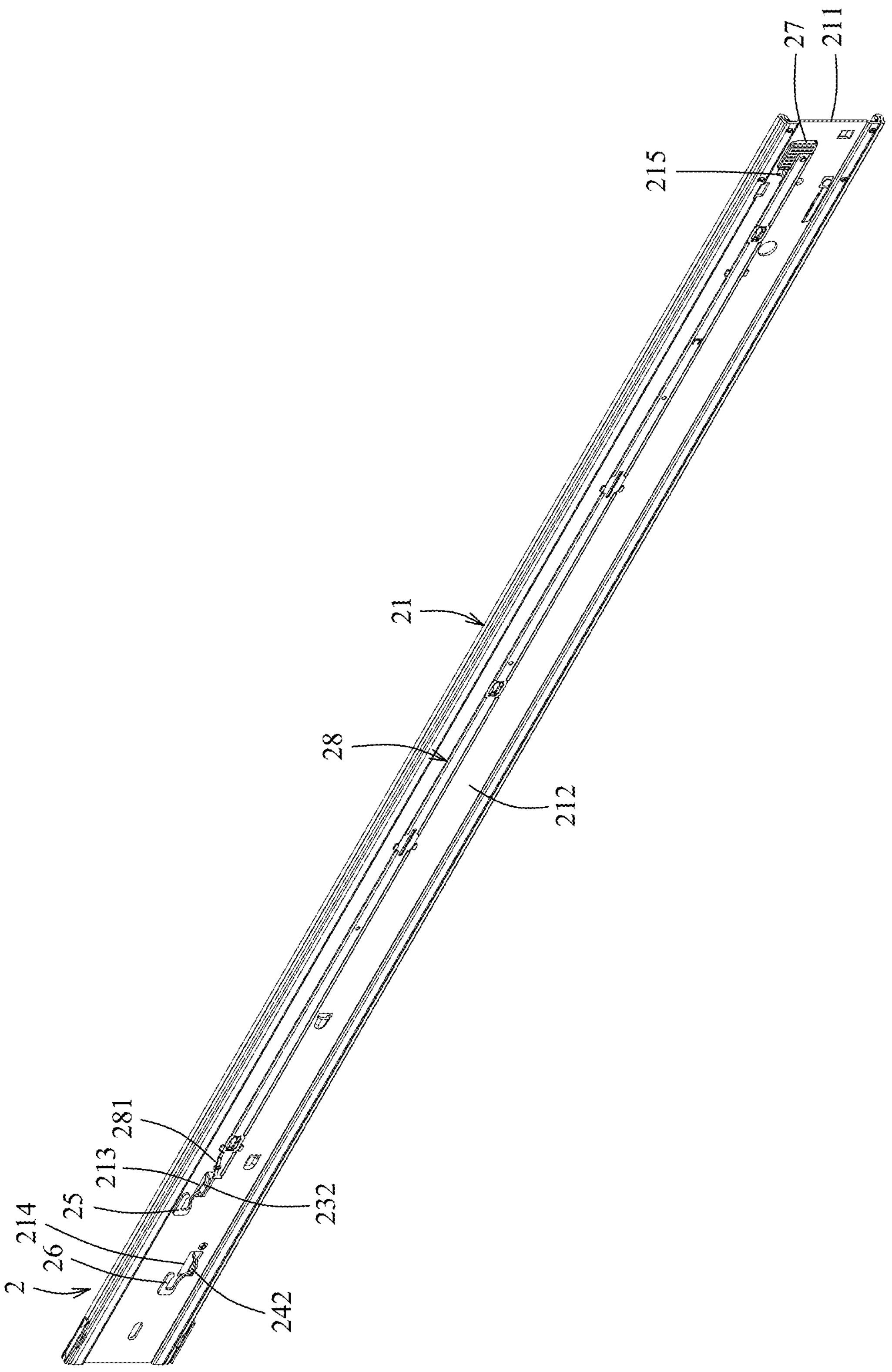
FIG. 5 is a perspective view of the middle section.
Figure 6:
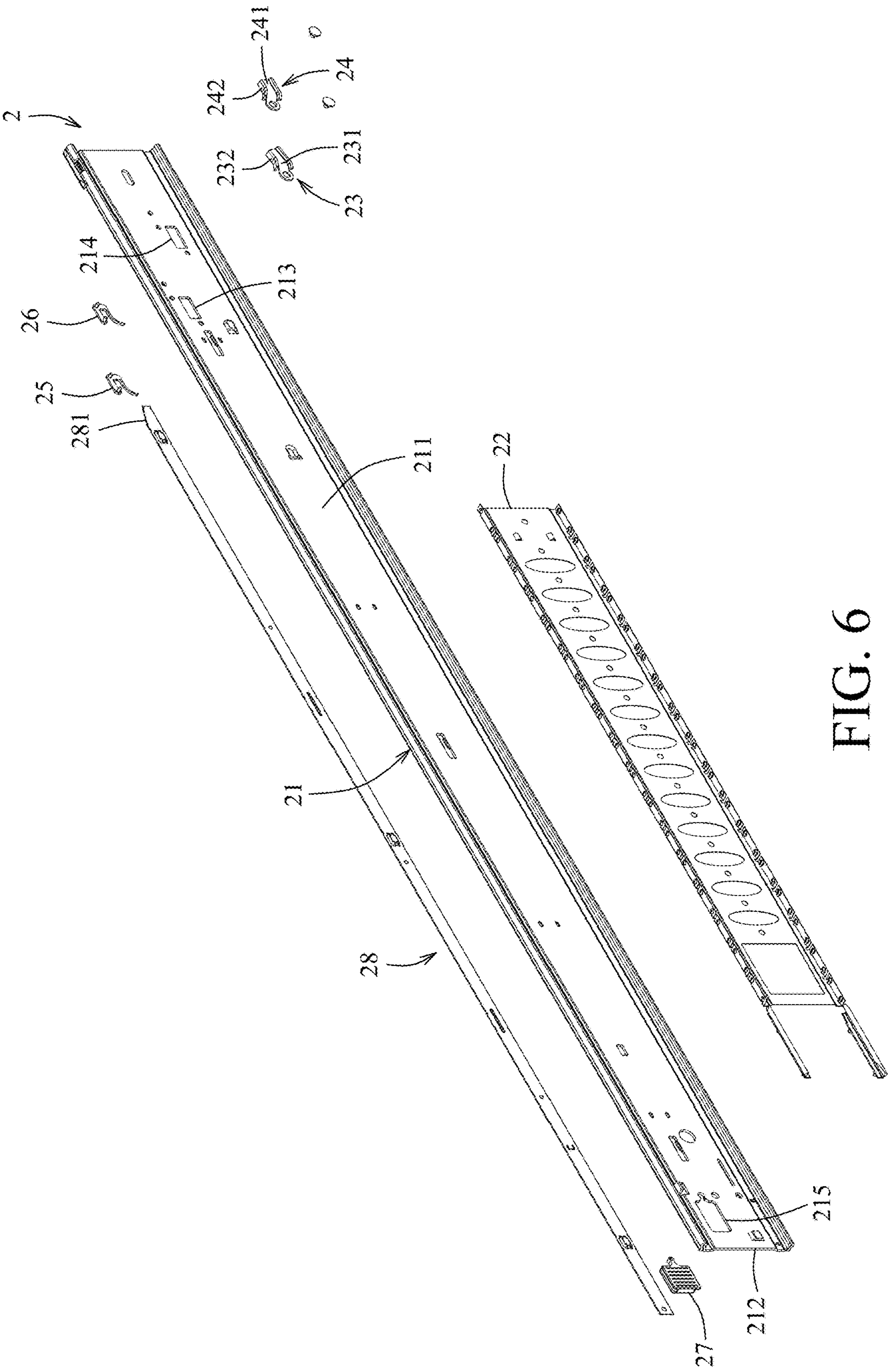
FIG. 6 is an exploded perspective view of the middle section.
Figure 17:
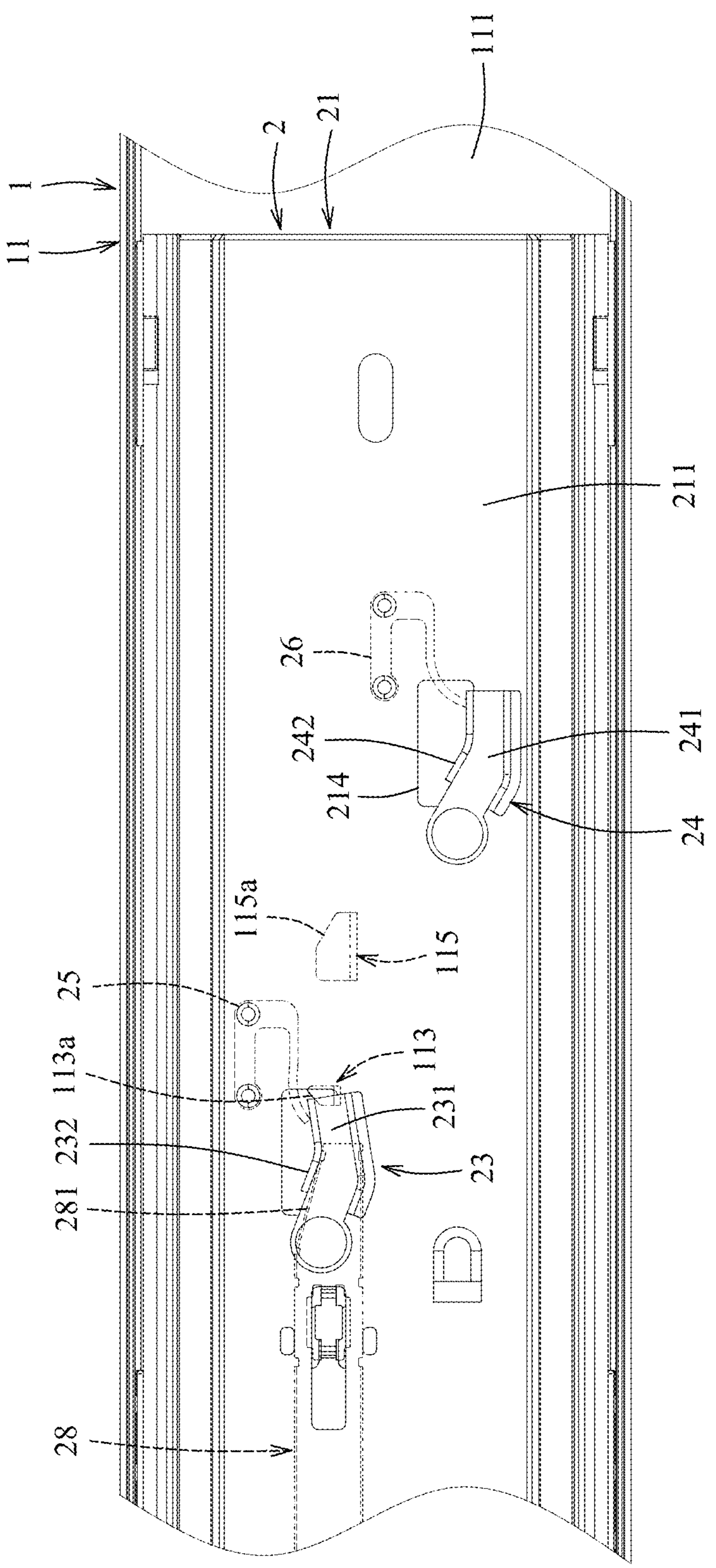
FIG. 17 is a fragmentary side view illustrating the anti-retraction locking member abutting against an abutting slope surface of an extension block when the middle section is pressed backward relative to the outer section.

With reference to FIGS. 2 and 3, the outer section 1 includes an outer rail 11, two ball chains 12 and two ball stop strips 13. The outer rail 11 has a sliding surface 111 for the middle section 2 to be slidably mounted, and a mounting surface 112 opposite to the sliding surface 111 that is securely mounted on the server rack. The ball chains 12 are disposed at upper and lower sides of the outer rail 11 for facilitating sliding of the middle section 2 relative to the outer rail 11. The ball stop strips 13 are respectively mounted on the upper and lower sides of the outer rail 11 to prevent removal of the ball chains 12 from the outer rail 11. An extension block 113, a first anti-retraction block 114, a second anti-retraction block 115, a releasing block 116 and a returning block 117 are disposed on the sliding surface 111 and are spaced apart from one another. The second anti-retraction block 115 is disposed between the extension block 113 and a proximal end (11*a*) of the outer rail 11. The returning block 117 is disposed adjacent to a distal end (11*b*) of the outer rail 11 and near the ball stop strips 13. The extension block 113 has an abutting slope surface (113*a*) at a left side thereof facing the distal end (11*b*) (see FIG. 17). The second anti-retraction block 115 has a second slope surface (115*a*) at a right side thereof facing the proximal end (11*a*) (see FIG. 17). The releasing block 116 has a releasing slope surface (116*a*) at a right side thereof facing the proximal end (11*a*) (see FIG. 11).

With reference to FIGS. 2, 4, 5 and 6, the middle section 2 includes a middle rail 21 which is disposed on and slidable along the outer rail 11 to shift the three-section slide rail device from a retracted state to a first extended state, a ball sliding plate 22 which is slidably disposed on the middle rail 21, an anti-retraction locking member 23 which is pivotably connected with the middle rail 21 adjacent to a proximal end of the middle rail 21, a driven member 24 which is pivotably mounted adjacent to the anti-retraction locking member 23, an anti-retraction biasing member 25 which is disposed on the middle rail 21 and which abuts against the anti-retraction locking member 23 to bias the anti-retraction locking member 23 downwardly (see FIG. 10), a driven biasing member 26 which is disposed on the middle rail 21 and which abuts against the driven member 24 to bias the driven member 24 downwardly (see FIG. 10), an operating member 27 which is movably disposed on the middle rail 21, and an elongated member 28 which extends from the operating member 27 along the middle rail 21. The middle rail 21 has an inner surface 211 for the inner section 3 to be slidably mounted, an outer surface 212 opposite to the inner surface 211 to face the outer section 1, an anti-retraction mounting slot 213 which is formed therein for the anti-retraction locking member 23 to be mounted, a driven mounting slot 214 which is formed adjacent to the anti-retraction mounting slot 213 for the driven member 26 to be mounted, and an operating mounting slot 215 for the operating member 27 to be mounted. The ball sliding plate 22 is slidably disposed on the inner surface 211 to facilitate the sliding of the inner section 3 relative to the middle section 2. The anti-retraction locking member 23 has a pivoting portion 231 which is pivotably mounted to the inner surface 211 of the middle rail 21, and an anti-retraction locking portion 232 which is connected with the pivoting portion 231 and extends through the anti-retraction mounting slot 213 to abut against and be biased by the anti-retraction biasing member 25. The anti-retraction locking member 23 is blocked by the anti-retraction block 114 (see FIG. 11) so as to prevent undesired retraction of the middle section 2 relative to the outer section 1. The driven member 24 has a pivoting portion 241 which is pivotably mounted to the inner surface 211 of the middle rail 21, and a driven portion 242 which is connected with the pivoting portion 241 and extends through the driven mounting slot 214 to abut against and be biased by the driven biasing member 26. Both the anti-retraction biasing member 25 and the driven biasing member 26 are disposed on the outer surface 212. The elongated member 28 is movably and partly engaged with the outer surface 212, and has a thrust end opposite to the operating member 27. The thrust end has a thrust slope surface 281 for abutting and thrusting the anti-retraction locking member 23.

Figure 7:
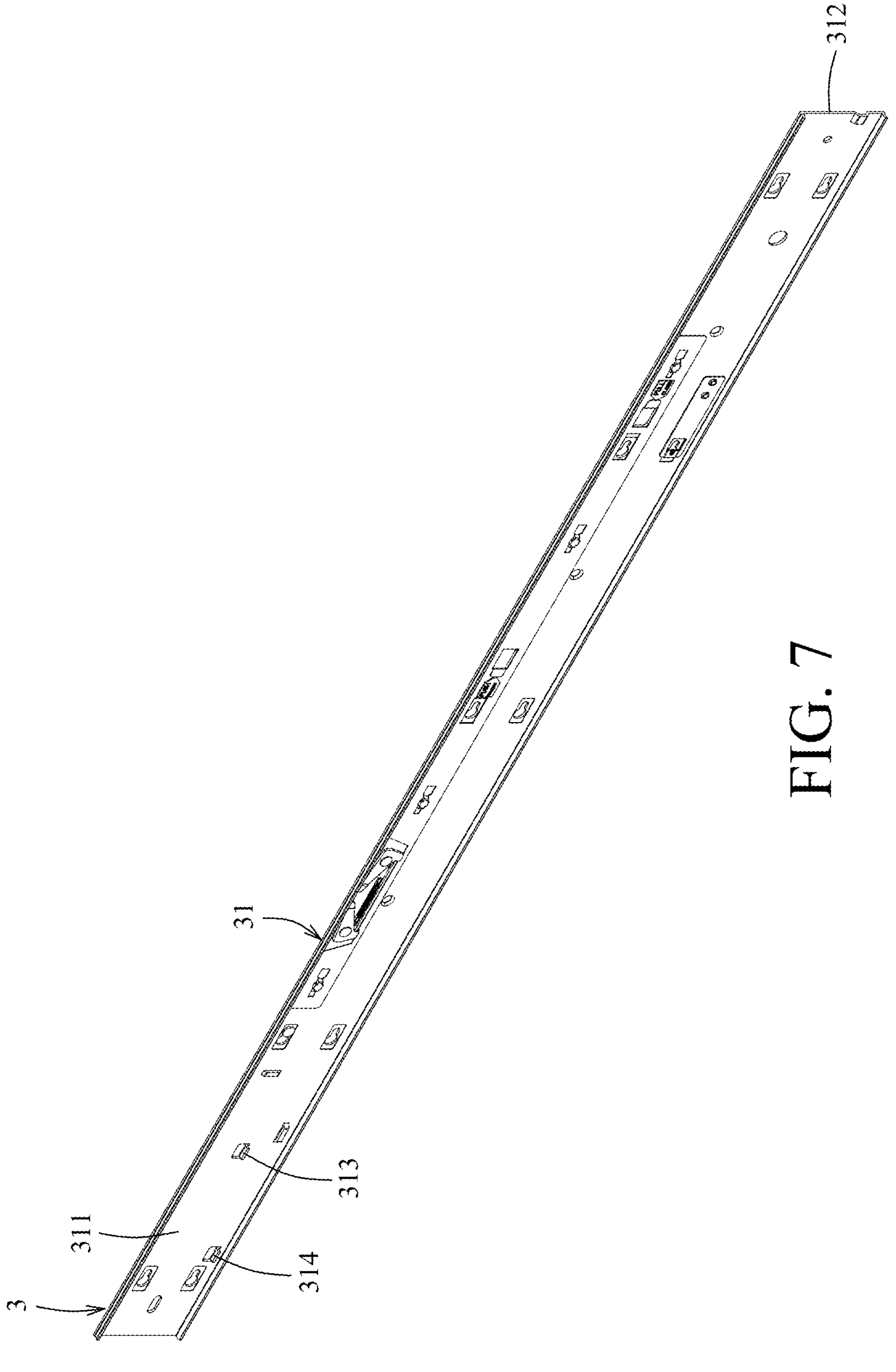
FIG. 7 is a perspective view of an inner section of the embodiment.

With reference to FIGS. 2 and 7, the inner section 3 includes an inner rail 31 which is disposed on and slidable along the middle rail 21 to shift the three-section slide rail device from the first extended state to a second extended state. The inner rail 31 has an inner surface 311 which faces the middle rail 21, an outer surface 312 opposite to the inner surface 311, an abutment plate 313 which is formed on the inner surface 311 adjacent to a proximal end of the inner rail 31, and a driving plate 314 which is formed on the inner surface 311 adjacent to the abutment plate 313.

Figure 8:
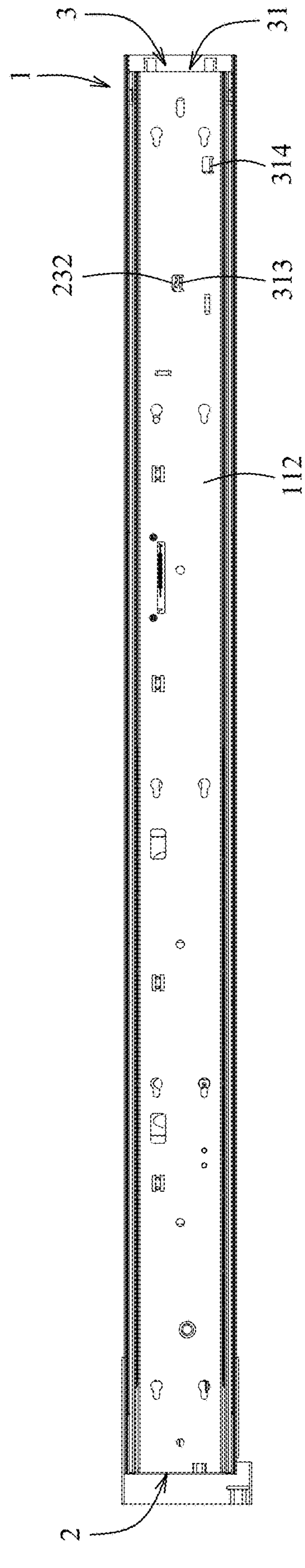
FIG. 8 is a side view illustrating the embodiment in a retracted state.
Figure 9:
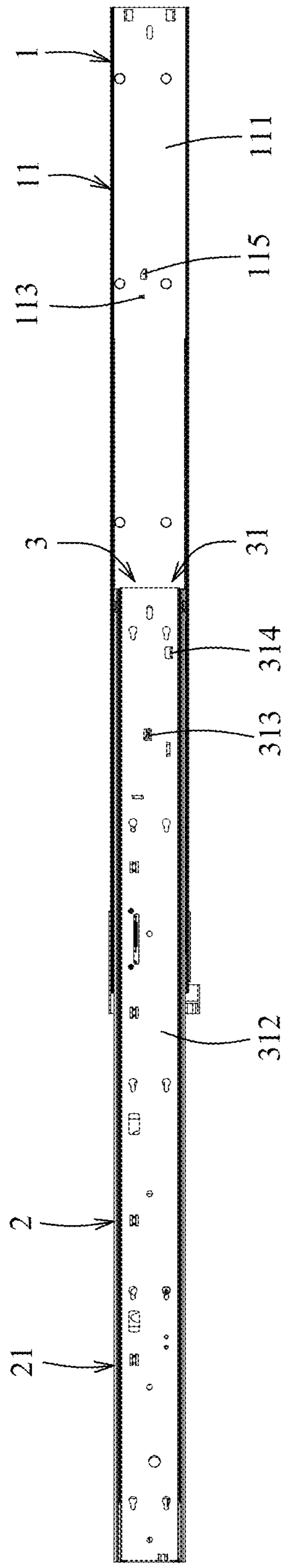
FIG. 9 is a side view illustrating the embodiment in a first extended state, where the middle section and the inner section are extended from the outer section.
Figure 14:
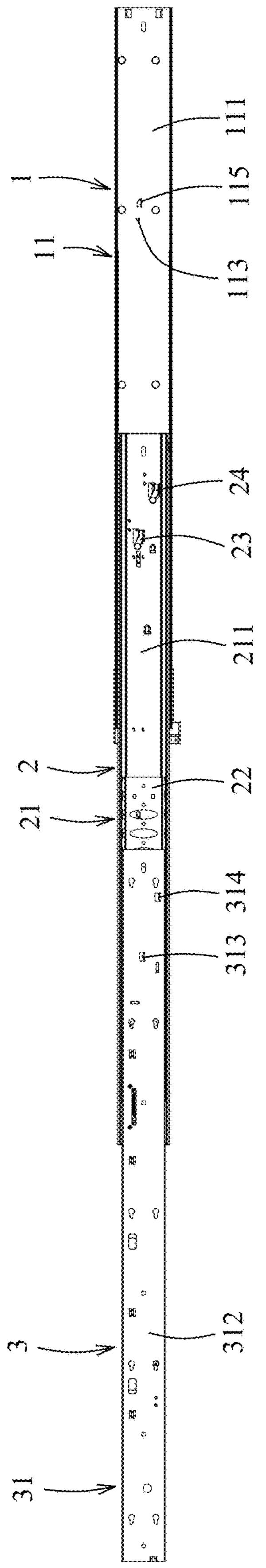
FIG. 14 is a side view illustrating the embodiment in a second extended state, where the middle section is extended from the outer section, and the inner section is extended from the middle section.

With reference to FIGS. 8, 9 and 14, the three-section slide rail device is shiftable among the retracted state, the first extended state and the second extended state. In the retracted state, the outer section 1, the middle section 2 and the inner section 3 are superimposed upon one another, as shown in FIG. 8. In the first extended state, the middle section 2 and the inner section 3 are extended from the outer section 1, as shown in FIG. 9. In the second extended state, the middle section 2 is extended from the outer section 1, and the inner section 3 is extended from the middle section 2, as shown in FIG. 14. The operation of the three-section slide rail device as it is shifted from the retracted state to the first extended state and then to the second extended state is described as follows.

Figure 10:
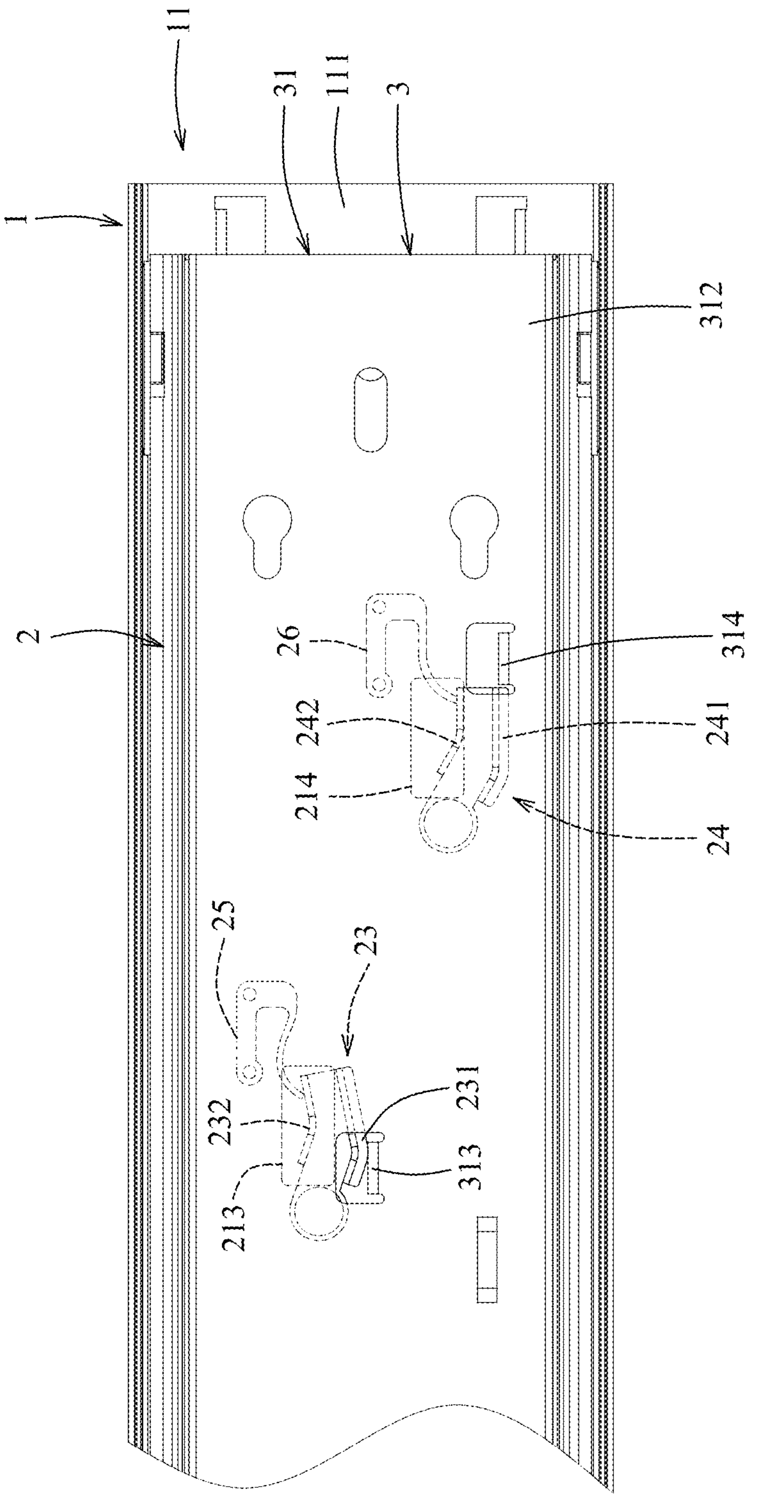
FIG. 10 is a fragmentary side view of the embodiment, illustrating an anti-retraction locking member and a driven member of the middle section engaged with an abutment plate and a driving plate of the inner section when the embodiment is in the retracted state.
Figure 11:
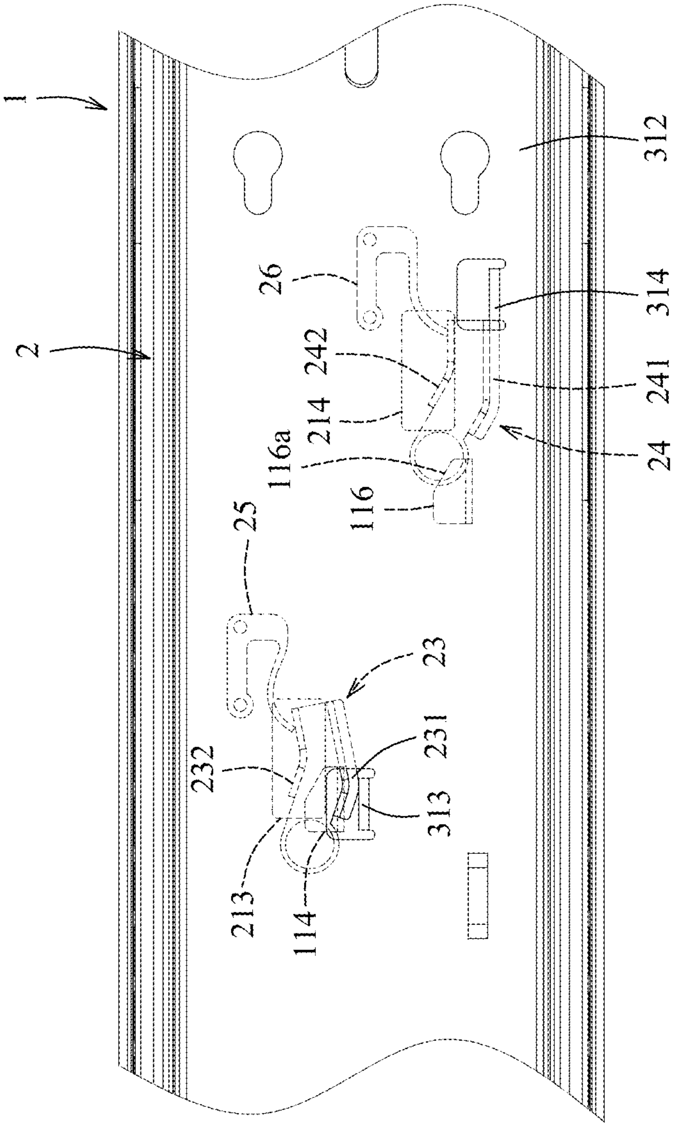
FIG. 11 is a fragmentary side view of the embodiment, illustrating the driven member of the middle section engaged with a releasing block of the outer section during the shifting of the embodiment from the retracted state toward the first extended state.
Figure 12:
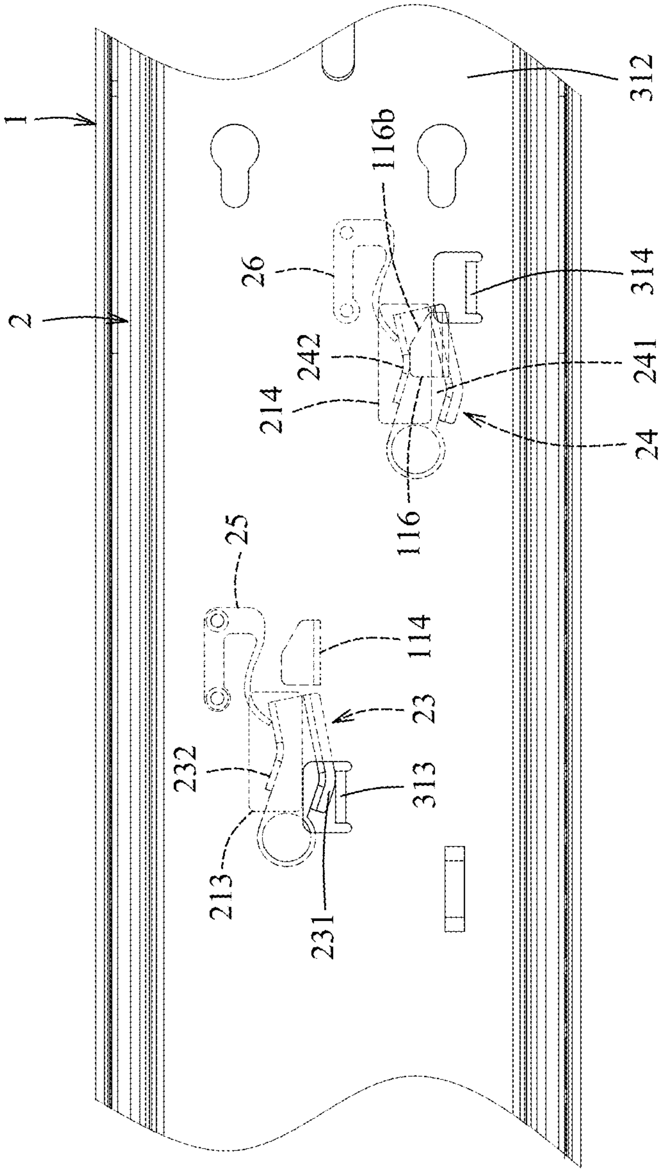
FIG. 12 is a fragmentary side view of the embodiment, illustrating the driven member disengaged from the driving plate when the embodiment is shifted to the first extended state.
Figure 13:
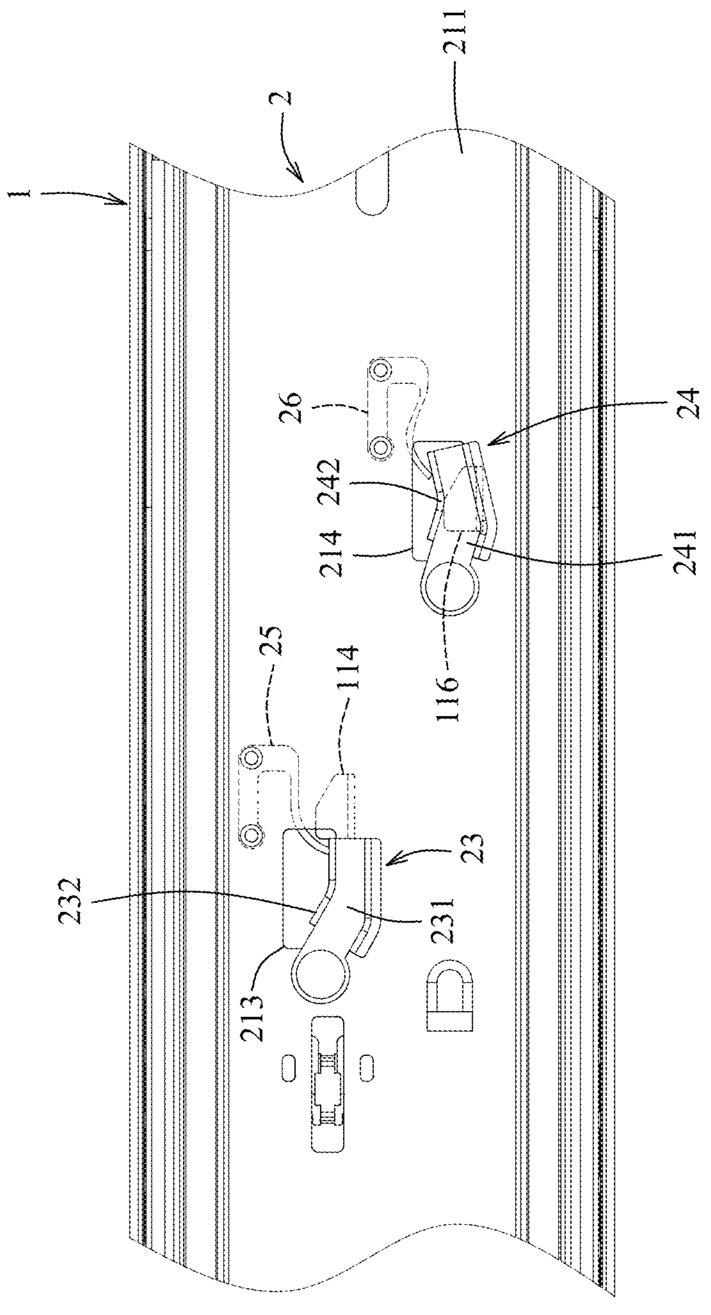
FIG. 13 is a fragmentary side view of the embodiment, illustrating the anti-retraction locking member disengaged from the abutment plate and turned downwardly and the middle section blocked by a first anti-retraction block of the outer section when the inner section is moved leftwardly relative to the middle section.

Firstly, an operator pulls the server case 10 and the inner section 3 as well, and the middle section 2 is moved due to the driving plate 314 abutting against the driven member 24 to shift to the first extended state. With reference to FIGS. 10 and 11, in the retracted state, the driven member 24 is abutted against the driving plate 314 and the anti-retraction locking member 23 is abutted upwardly by the abutment plate 313. During shifting to the first extended state, the driven member 24 is to be engaged with the releasing block 116 of the outer section 1. Next with reference to FIG. 12, the driven member 24 is in abutting engagement with and pressed upwardly by the releasing slope surface (116*a*) of the releasing block 116 so as to not abut against the driving plate 314, thereby permitting movement of the inner section 3 relative to the middle section 2, and thus the inner section 3 is moved out further relative to the middle section 2 (leftwardly in FIG. 12). Then with reference to FIG. 13, after the leftward movement of the inner section 3 relative to the middle section 2, with the abutment plate 313 disengaged from the anti-retraction locking member 23, the anti-retraction locking member 23 is turned downwardly by the biasing action of the anti-retraction biasing member 25 such that the middle section 2 is blocked by the first anti-retraction block 114 to prevent rightward retraction thereof and be positioned relative to the outer section 1. The inner section 3 can be moved out further relative to the middle section 2 to shift the three-section slide rail device to the second extended state, as shown in FIG. 14.

Figure 15:
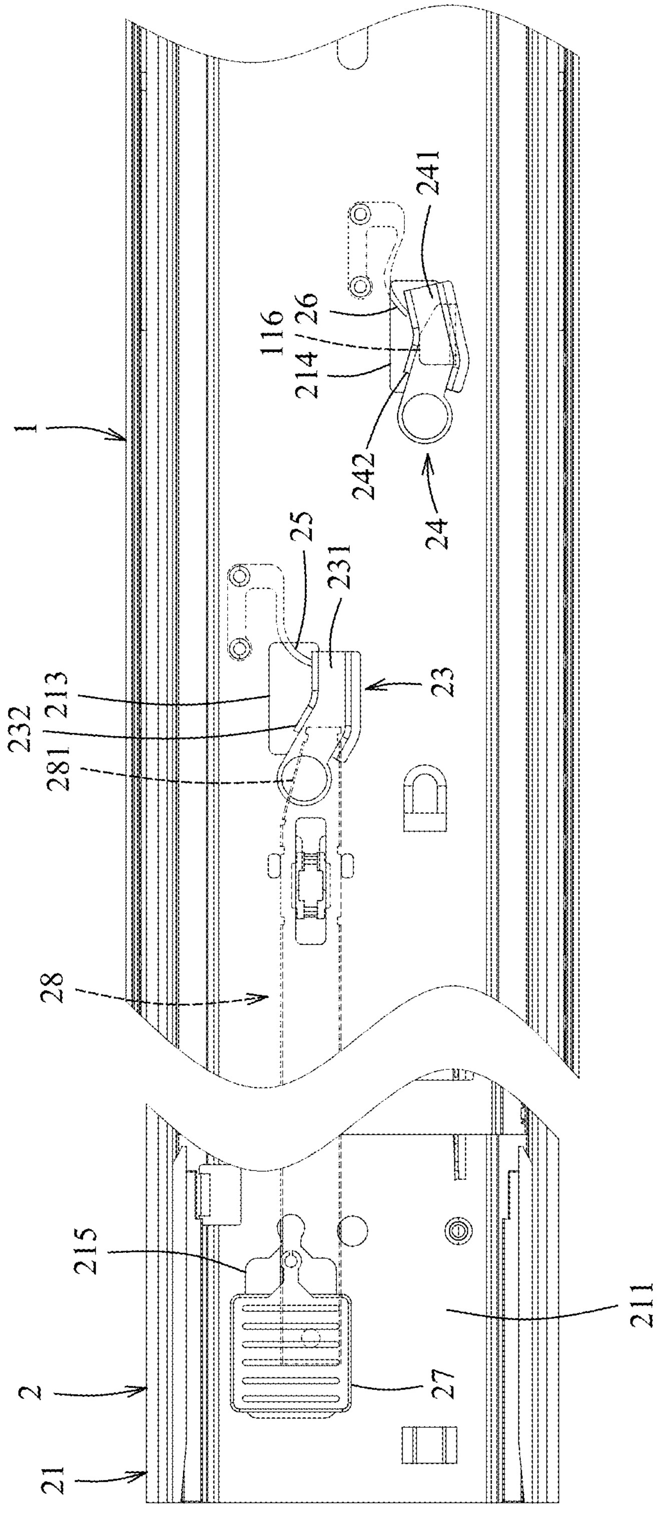
FIG. 15 is a fragmentary side view illustrating the embodiment in the second extended state and the inner section removed from the middle section.
Figure 16:
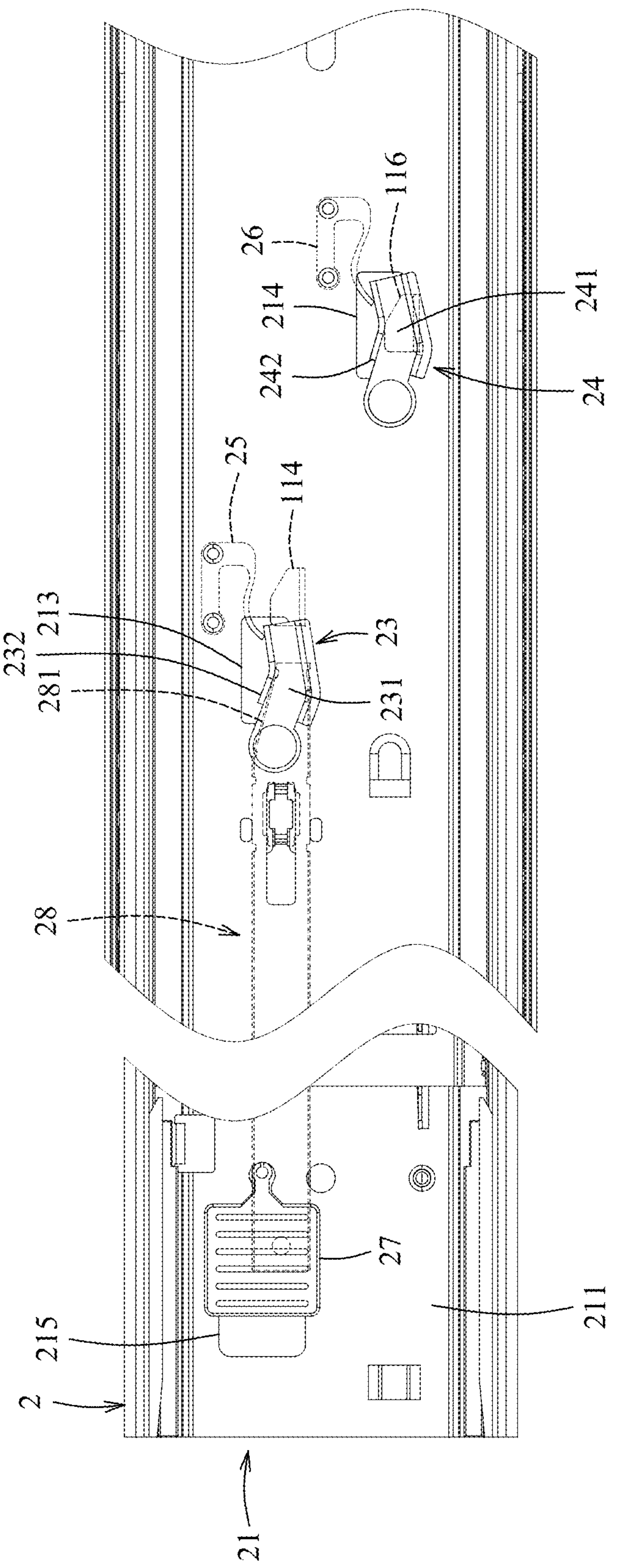
FIG. 16 is a fragmentary side view illustrating the embodiment in the second extended state, the inner section removed from the middle section, and an operating member operated rightwardly to bring an elongated member to turn the anti-retraction locking member upwardly.
Figure 18:
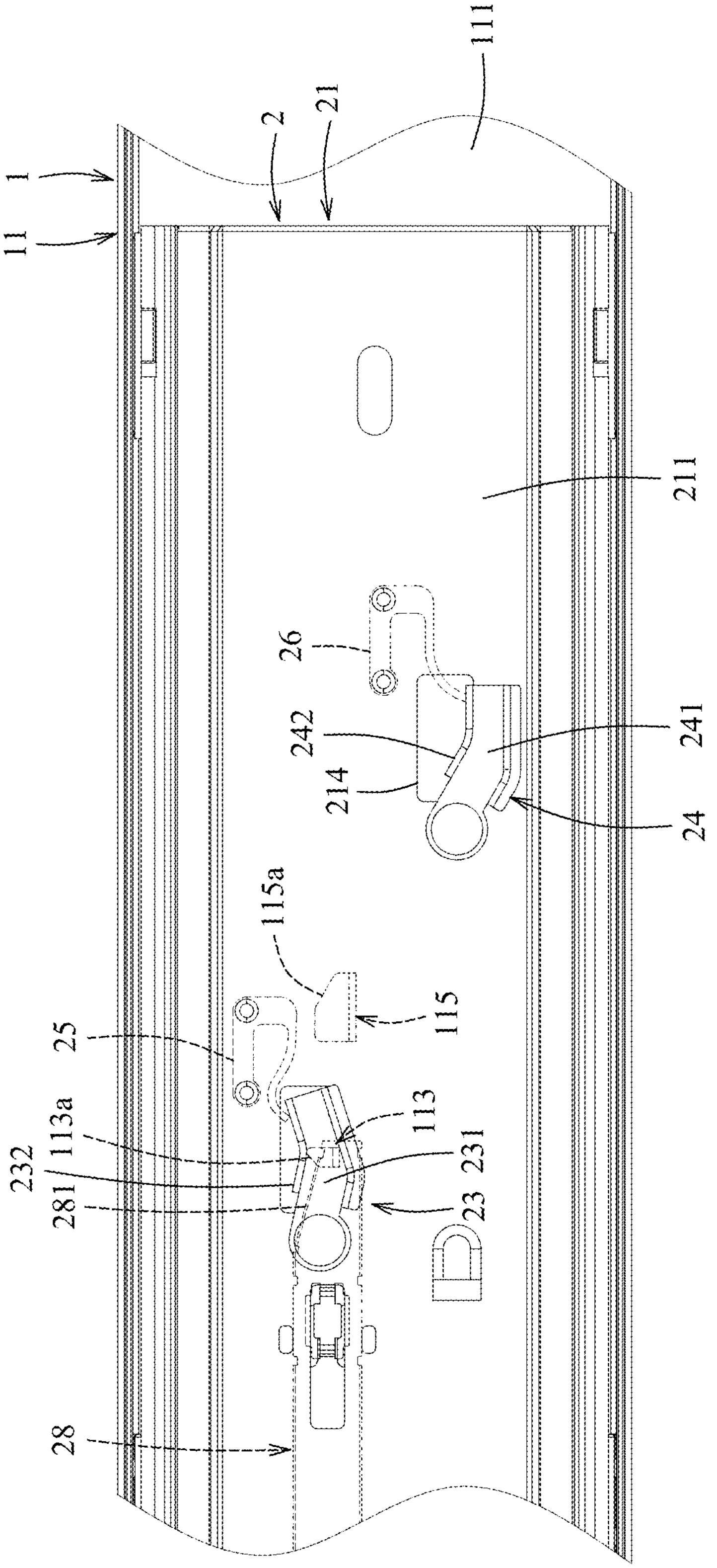
FIG. 18 is a fragmentary side view illustrating the anti-retraction locking member moved over the extension block and turned upwardly when the middle section is further pressed backward relative to the outer section.
Figure 19:
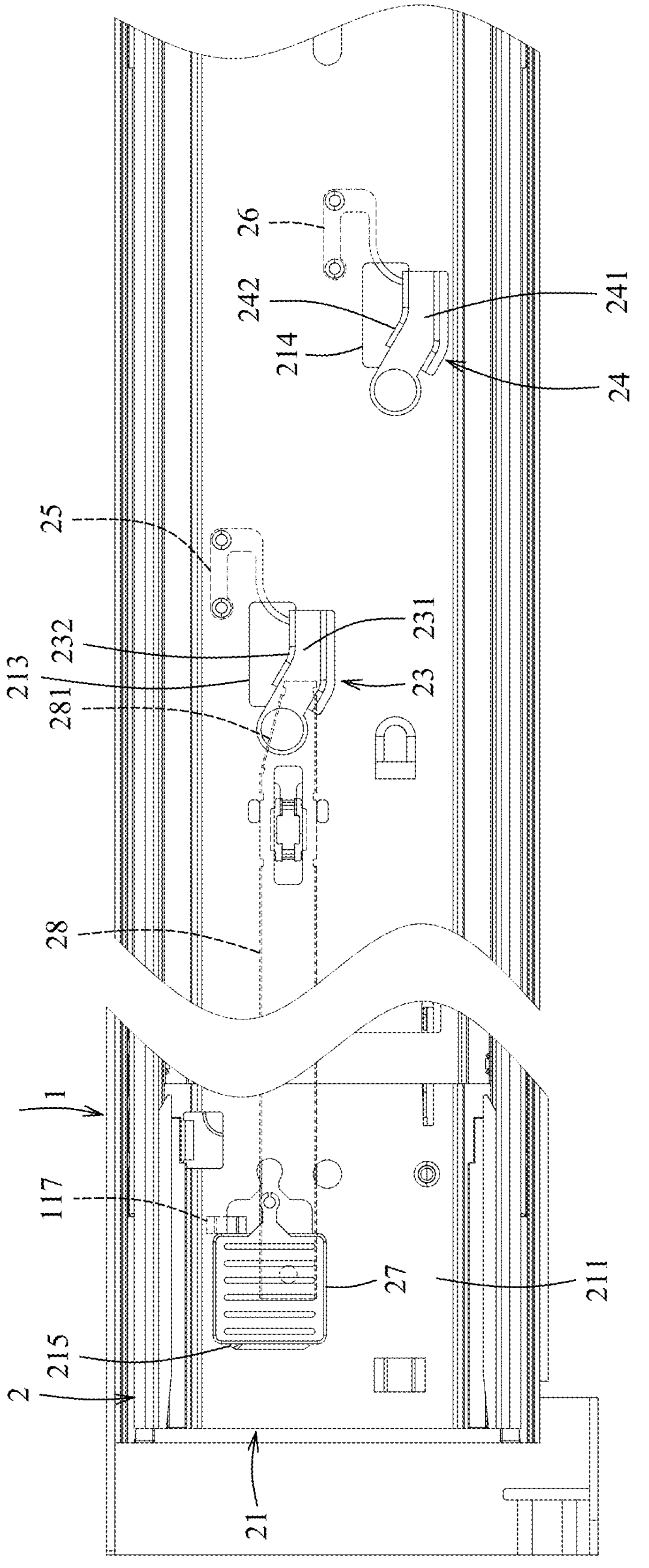
FIG. 19 is a fragmentary side view illustrating the operating member moved to return back its original position to bring the elongated member to disengage from the anti-retraction locking member when the middle section is further pressed backward relative to the outer section.

With reference to FIG. 15, when it is desired to conduct maintenance of the server case 10 (see FIG. 1), the server case 10 and the inner section 3 should be removed from the middle section 2, and the middle section 2 should be pressed back relative to the outer section 1. Then with reference to FIGS. 16 to 18, the operating member 27 is pressed rightwardly toward the anti-retraction locking member 23 to move the elongated member 28 and bring the thrust slope surface 281 to turn the anti-retraction locking member 23 to move upwardly so as to disengage the anti-retraction locking member 23 from the first anti-retraction block 114. And during the returning movement of the middle section 2, the anti-retraction locking portion 232 of the anti-retraction locking member 23 abuts against the abutting slope surface (113*a*) of the extension block 113 and is further turned upwardly and over the extension block 113. Then with reference to FIG. 19, when the middle section 2 is moved back to shift the three-section slide rail device back to the retracted state, the operating member 27 abuts against the returning block 117 and is brought into leftward movement to return to its original position, and the elongated member 28 is returned to its original position to disengage from the anti-retraction locking member 23 so as to permit downward turning of the anti-retraction locking member 23.

Figure 20:
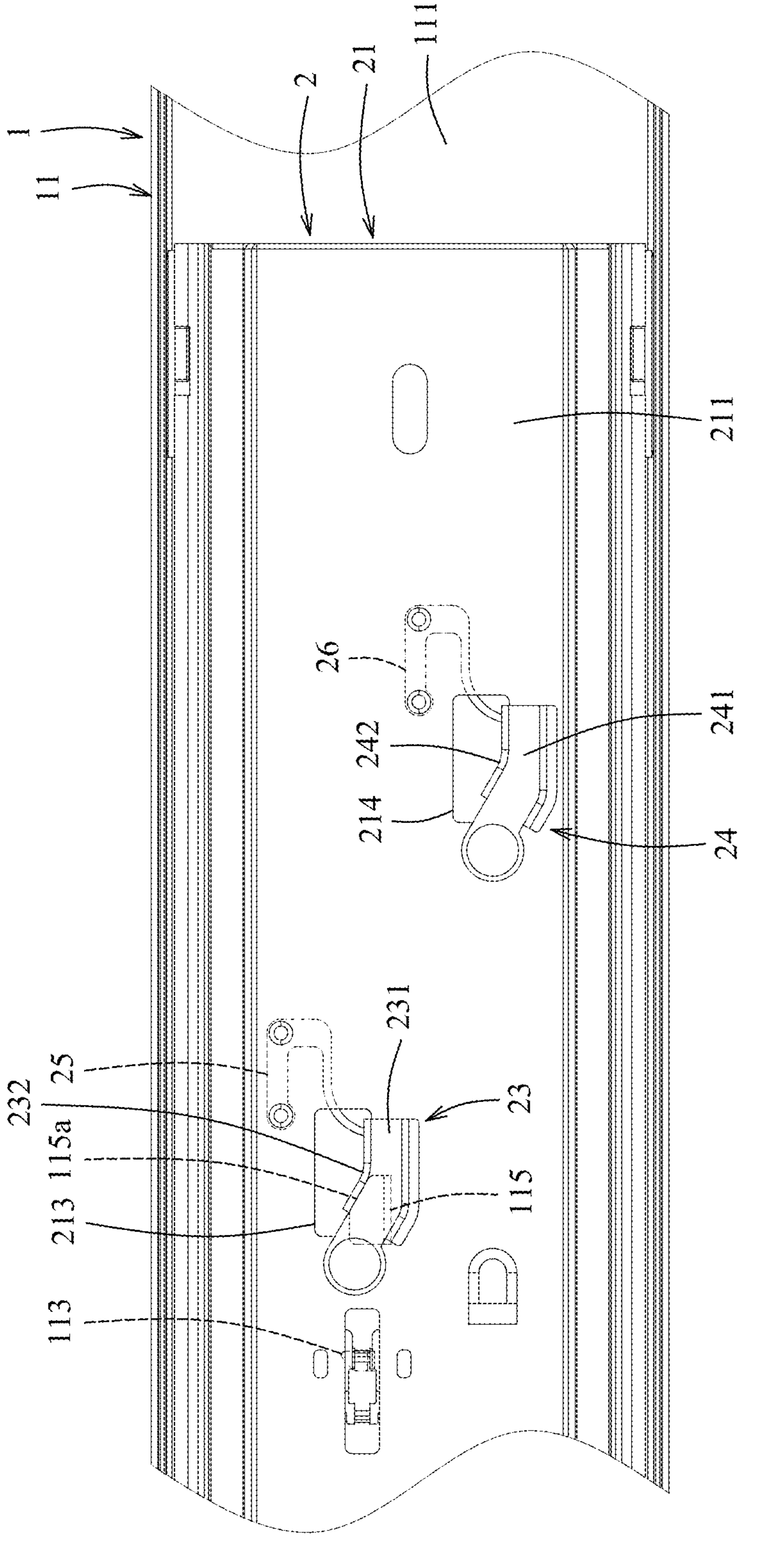
FIG. 20 is a fragmentary side view illustrating the anti-retraction locking member abutting against a second slope surface of a second anti-retraction block when the middle section is extended again relative to the outer section.
Figure 21:
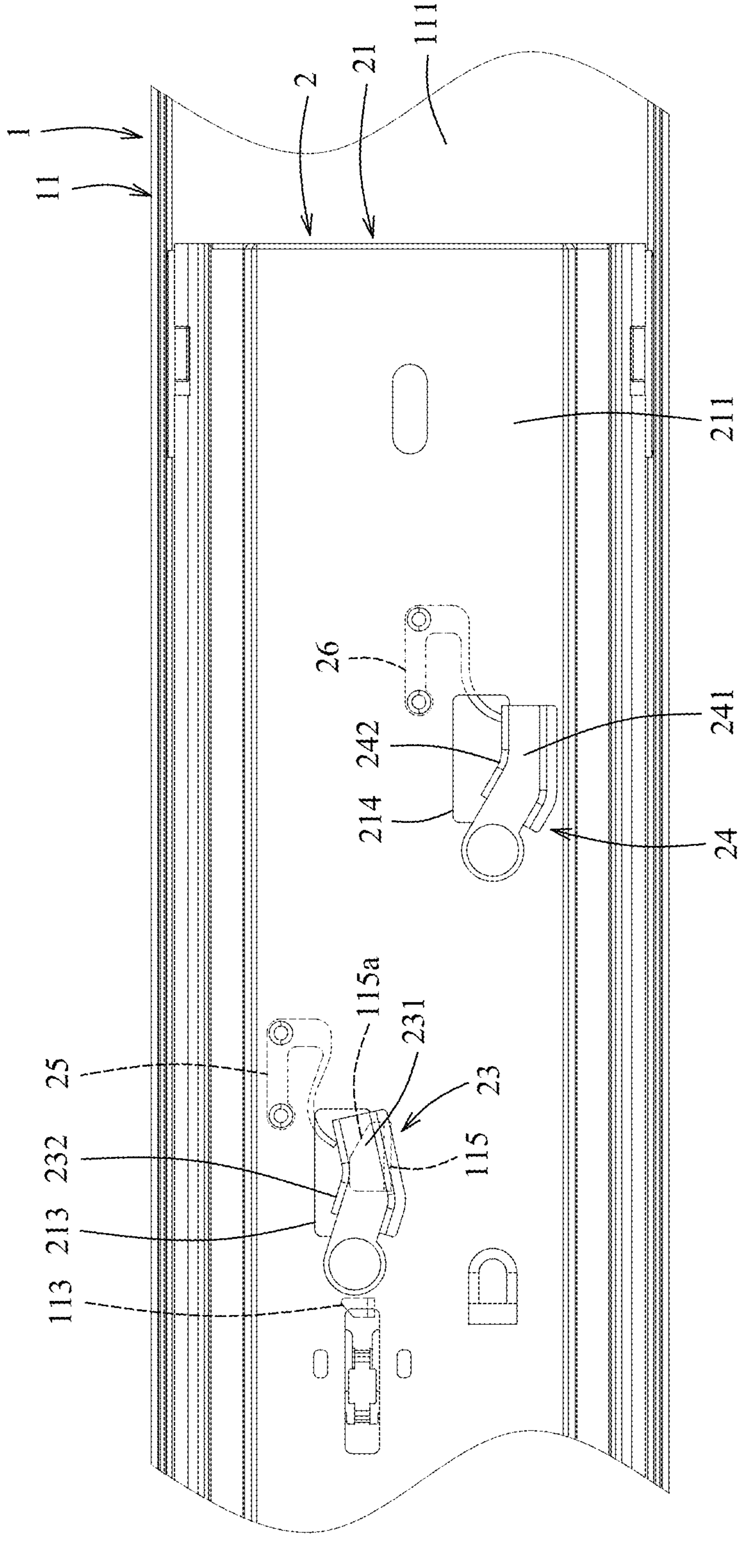
FIG. 21 is a fragmentary side view illustrating the anti-retraction locking member urged upwardly by the second anti-retraction block when the middle section is further extended relative to the outer section.
Figure 22:
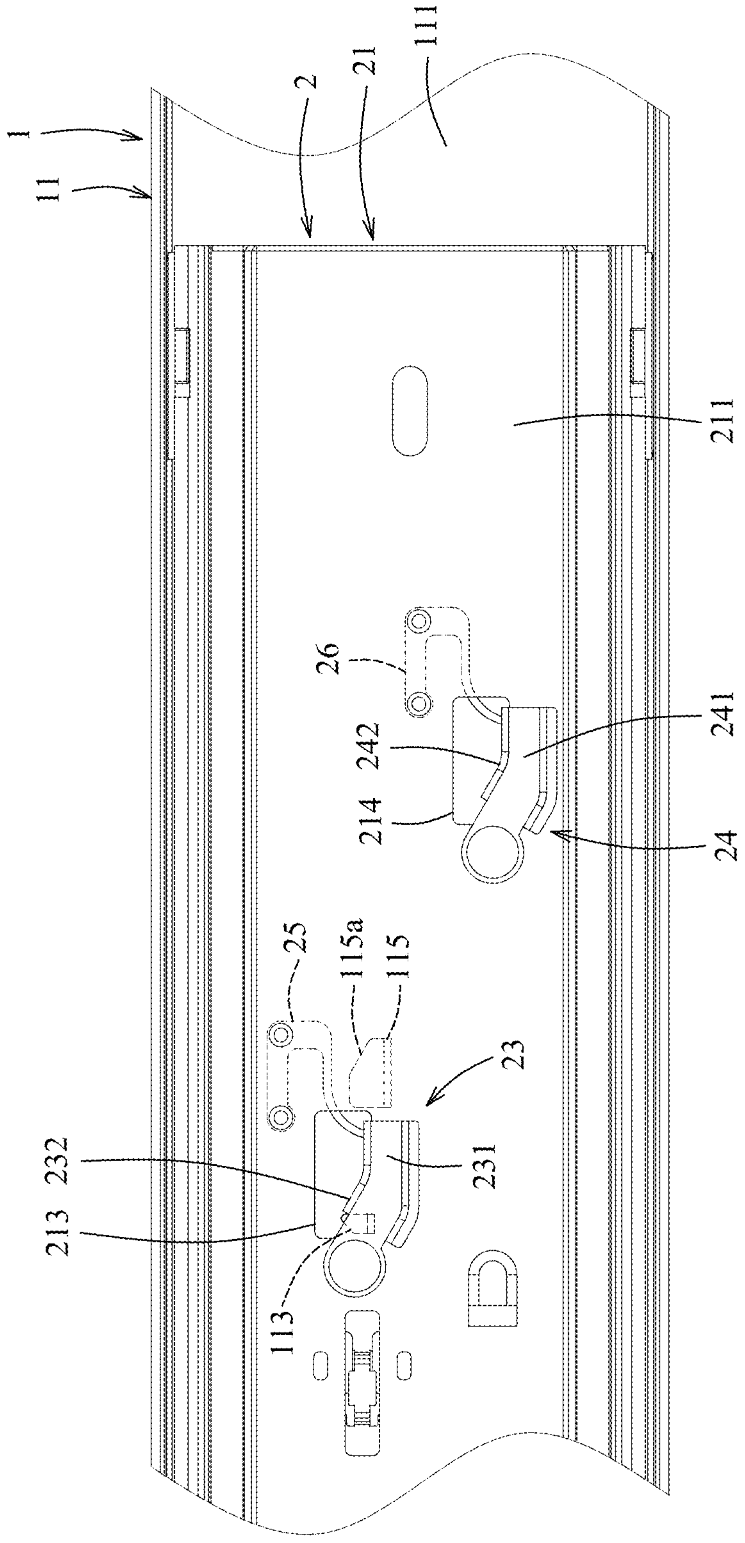
FIG. 22 is a fragmentary side view illustrating the embodiment in a short extended state where the anti-retraction locking member is moved over the second anti-retraction block and is turned downwardly to abut against the extension block.
Figure 23:
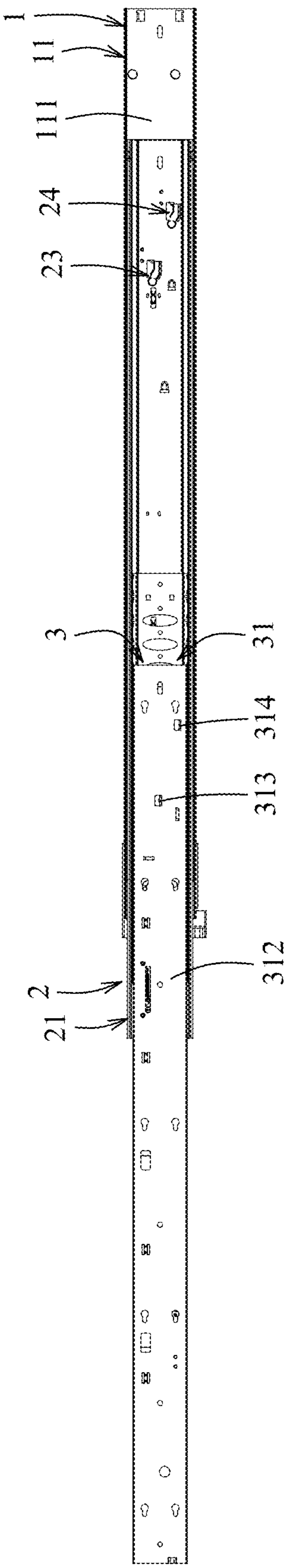
FIG. 23 is a side view illustrating the embodiment in the short extended state and the inner section reinstalled on the middle section.

With reference to FIGS. 20 to 23, when the server case 10 (see FIG. 1) and the inner section 3 are to be placed back on the middle section 2 after the maintenance conduction of the server case 10 is completed, the middle section 2 can be moved relative to the outer section 1 by a short distance to shift the three-section slide rail device to a short extended state. During this movement of the middle section 2 relative to the outer section 1, the anti-retraction locking portion 232 of the anti-retraction locking member 23 abuts against the second slope surface (115*a*) of the second anti-retraction block 115, as shown in FIG. 20. Subsequently, the anti-retraction locking member 23 is turned upwardly along the second slope surface (115*a*), as shown in FIG. 21. Finally, the anti-retraction locking member 23 is moved over the second anti-retraction block 115 and is then turned downwardly to abut against the extension block 113, as shown in FIG. 22, to prevent a further extending movement of the middle section 2 relative to the outer section 1 while the second anti-retraction block 115 prevents further retraction movement of the middle section 2 relative to the outer section 1. Thus, the middle section 2 is positioned relative to the outer section 1 in the short extended state. With the middle section 2 moved back relative to the outer section 1 to shorten the extension length thereof from the outer section 1, an operating space can be provided to facilitate conducting of maintenance, and the torque applied to the three-section slide rail device by the server case 10 is also reduced to prevent the inner section 3 and the server case 10 from slipping and falling over from the middle section 2 to damage to the operator and the server case 10. The server case 10 and the inner section 3 can be smoothly placed back on the middle section 2, as shown in FIG. 23 (the server case 10 being not shown in FIG. 23).

As illustrated, with the anti-retraction locking member 23 abutting against the extension block 113, the middle section 2 is moved relative to the outer section 1 and positioned in the short extended state to prevent further extension of the middle section 2 relative to the outer section 1. Since the extension length of the middle section 2 from the outer section 1 is shortened, an operating space can be provided for facilitate conducting of maintenance, and the torque applied to the three-section slide rail device by the server case 10 is also reduced to prevent the inner section 3 and the server case 10 from slipping and falling over from the middle section 2 and damaging the operator and the server case 10.

While the disclosure has been described in connection with what is considered the exemplary embodiment, it is understood that this disclosure is not limited to the disclosed embodiment but is intended to cover various arrangements included within the spirit and scope of the broadest interpretation so as to encompass all such modifications and equivalent arrangements.

What is claimed is:

1. A three-section slide rail device, comprising:

an outer section including an outer rail, said outer rail having a sliding surface and an extension block formed on said sliding surface;

a middle section including a middle rail which is disposed on and slidable along said outer rail to shift said three-section slide rail device from a retracted state to a first extended state, and an anti-retraction locking member which is pivotably connected with said middle rail adjacent to a proximal end of said middle rail; and an inner section including an inner rail which is disposed on and slidable along said middle rail to shift said three-section slide rail device from the first extended state to a second extended state, said inner rail having an inner surface which faces said middle rail, and an abutment plate which is formed on said inner surface adjacent to a proximal end of said inner rail, said abutment plate abutting against and urging upwardly said anti-retraction locking member to keep said anti-retraction locking member in the retracted state, wherein, when said inner section is moved relative to said middle section to disengage said abutment plate from said anti-retraction locking member, said anti-retraction locking member is permitted to turn downwardly so as to allow said middle section to move relative to said outer section to a short extended state, where said anti-retraction locking member abuts against said extension block to prevent a further extending movement of said middle section relative to said outer section.

2. The three-section slide rail device of claim 1, wherein said outer rail further has a first anti-retraction block which is formed on said sliding surface and spaced apart from said extension block, said middle section further including an operating member which is movably disposed on said middle rail, and an elongated member which extends from said operating member along said middle rail, wherein, during the shifting of said three-section slide rail device from the retracted state to the first extended state, said anti-retraction locking member is turned downwardly and abuts against said first anti-retraction block so as to prevent retraction of said middle section relative to said outer section to keep said three-section slide rail device in the first extended state, and wherein, when said three-section slide rail device is in the second extended state, said operating member is operably moved toward said anti-retraction locking member to bring said elongated member to turn said anti-retraction locking member upwardly so as to disengage said anti-retraction locking member from said first anti-retraction block.

3. The three-section slide rail device of claim 2, wherein said elongated member has a thrust end opposite to said operating member, said thrust end having a thrust slope surface for abutting and thrusting said anti-retraction locking member.

4. The three-section slide rail device of claim 1, wherein said outer rail further has a second anti-retraction block which is formed on said sliding surface and between said extension block and said proximal end of said outer rail, wherein, when said three-section slide rail device is in the short extended state, said anti-retraction locking member abuts against said second anti-retraction block so as to prevent retraction of said middle section relative to said outer section.

5. The three-section slide rail device of claim 2, wherein said outer rail further has a returning block which is formed on said sliding surface adjacent to a distal end of said outer rail remote from said extension block, wherein, during retraction of said middle section relative to said outer section, said returning block is in abutting engagement with said operating member to return said operating member to its original position.

* * * * *